United States Patent [19]

Farnworth

[11] Patent Number: 5,218,229

[45] Date of Patent: Jun. 8, 1993

[54] INSET DIE LEAD FRAME CONFIGURATION LEAD FRAME FOR A SEMICONDUCTOR DEVICE HAVING MEANS FOR IMPROVED BUSING AND DIE-LEAD FRAME ATTACHMENT

[75] Inventor: Warren M. Farnworth, Boise, Id.

[73] Assignee: Micron Technology, Inc., Boise, Id.

[21] Appl. No.: 753,291

[22] Filed: Aug. 30, 1991

[51] Int. Cl.$^5$ .................. H01L 23/12; H01L 23/50
[52] U.S. Cl. ................................. 257/676; 257/666
[58] Field of Search ............... 357/70, 68; 257/666, 257/668, 676

[56] References Cited

U.S. PATENT DOCUMENTS

| | | | |
|---|---|---|---|
| 4,089,733 | 5/1978 | Zimmerman | 357/70 |
| 4,214,120 | 7/1980 | Jones, Jr. et al. | 357/70 |
| 4,459,607 | 7/1984 | Reid | 357/70 |
| 4,797,726 | 1/1989 | Manabe | 357/70 |

FOREIGN PATENT DOCUMENTS 59-175753 10/1984 Japan ............... 357/70

Primary Examiner—Rolf Hille
Assistant Examiner—S. V. Clark
Attorney, Agent, or Firm—Stanley N. Protigal

[57] ABSTRACT

A lead frame design having a ring which encircles the die is described which provides a bus to the semiconductor die attached thereto. The bus would be most commonly used for power or ground, although other embodiments are possible. It is known that large buses designed around the periphery of a semiconductor die can cause the corners of the die to crack, causing a variety of problems including in-circuit failures, as well as using die surface area. The invention removes the need for having a large bus on the chip and places it as an element of the lead frame. A first inventive embodiment employs tape to secure the die to the lead frame, while in a second embodiment attachment of the die to the lead frame is accomplished with no glue, tape, or eutectic means, and instead uses friction between the die and flexible support pins which extend from the ring encircling the die.

17 Claims, 4 Drawing Sheets

INSET DIE LEAD FRAME CONFIGURATION LEAD FRAME FOR A SEMICONDUCTOR DEVICE HAVING MEANS FOR IMPROVED BUSING AND DIE-LEAD FRAME ATTACHMENT

FIELD OF THE INVENTION

This invention relates to the field of semiconductor manufacturing. More specifically, a lead frame design is described which permits the use of a thicker lead frame material while allowing for a thin package. The design also has means for supplying power, ground, or other signals to the die, without the need for a large on-chip bus. One embodiment allows attachment of the die to the lead frame using friction between the lead frame metal and the die, thereby preventing problems caused by thermal coefficient of expansion differences between the die, lead frame, and attach material.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die on each wafer produced. The die are separated with a wafer saw, and then packaged into individual components.

During the packaging process, several semiconductor die are attached to a lead frame, often with a material such as epoxy or other viscous adhesives. Bond wires couple each of several bond pads on each die to conductive lead "fingers" on the lead frame. Leads are interposed between the lead fingers and the host. The die, the wires, and a portion of the leads are encapsulated in plastic. The leads on the lead frame couple the die with the device into which the component is installed, thereby forming an electrical pathway and a means of input/output (I/O) between the die and the host.

One step of semiconductor manufacture that is not without problems is the die-lead frame attachment. FIG. 1 shows a die 10 attached to a paddle 12 of a lead frame 14. The paddle 12 is usually about the same length and width as the die 10, but is shown larger than the die 10 for illustration purposes. Die pads 16 are attached by bond wires 18 to lead fingers 20 of the lead frame 14. The die 10 and a portion of the lead frame, shown by 22, is then encapsulated in a protective plastic casing. The lead portion 23 of the lead frame 14 will extend to the outside of the plastic, thereby allowing a means of I/O between the die 10 in the package and the host into which the package is installed. Below is a partial list of current methods of attaching the die 10 to the paddle 12:

1. Epoxy Paste—The epoxy is dispensed on the die paddle area of the lead frame. The die is lowered into the uncured epoxy by a surface contact tool or an edge contact only tool (collet) and held by the tool long enough to ensure adhesion. X-Y movement (scrub) is sometimes used to increase adhesion and speed the process. This process requires a follow-on cure in a separate cure oven.

2. Epoxy Film—An epoxy film is dispensed on the die paddle of the lead frame and the die is lowered down to the film surface. Bonding is aided by pressure between the die and paddle. This process requires a follow-on cure in a separate cure oven.

3. Epoxy Film on Tape—An epoxy film is applied to both sides of a supporting tape, and the tape is interposed between the die and the paddle. Pressure is applied between the die and paddle to improve bonding, then the assembly is cured in a separate curing step.

4. Eutectic—A metal with a low melting temperature (solder) is dispensed onto the lead frame paddle. A die is placed on the dispensed metal. Adhesion is obtained by an intermixing of the die backside and the metal. Controlled pressure, scrub, and temperature are often used. No follow-on cure is required.

5. Soft Solder—Same process as in Eutectic except that the metal does not mix with the backside material.

6. Glue—A conductive or non-conductive glue can be used as required. The glue is normally a quick set type adhesive which requires no later cure.

Various problems are associated with the connection of the die to the die paddle, and with the connection of the wires from the die pad to the lead fingers. A few of the difficulties associated with the die-lead frame attachments and wire bonds are described below.

1. Lead movement—Lead movement occurs after wire bonding. The lead fingers are relatively long for their thickness, and therefore can bend and move around quite easily. As the assembly is transported to location of the encapsulation step, the wire connections are easily broken. Lead movement increases as the thickness of the lead frame decreases.

2. Paddle—The paddle of the lead frame itself is stamped to a lower plane during the manufacturing process, thereby positioning the bottom of the die below the lead fingers on the lead frame, as shown in FIG. 2. The paddle downset 24 positions the die 10 so that the distance from the top of the die 10 to the bottom of the paddle 12 is centered with respect to the lead frame 14. For example, in FIG. 2, if an 11 mil die 10 is attached with a 1 mil thick attach material 26 to a 10 mil lead frame 14 having a paddle downset 24 of 6 mils. In the configuration of FIG. 2, the die 10 extends 6 mils above the lead frame 14, with 6 mils of paddle 12 extending below the lead frame 14. In this configuration, the amount of material above the die 10 equals the amount of material below the lead frame 14, and therefore the flow of plastic during the encapsulation process would not unduly stress the bond wires and would produce a higher yield.

In contrast, FIG. 3 shows a 11 mil thick die 10 attached with a 1 mil thick attach material 26 to a 10 mil thick lead frame 14 without a paddle downset. The top surface of the die 10 extends 12 mils above the lead frame 14, with nothing extending below the bottom of the lead frame 14. This configuration would produce a low yield, due to the unfavorable flow of plastic material around the die 10 and bond wires 18 during the encapsulation step. While some leeway is allowable, a 12 mil difference is not. In addition to problems caused by the uneven flow of encapsulation material, a package without a paddle downset bows due to the shrinkage of encapsulation material as it cures.

In addition to providing a centered die, the downset allows for shorter bond wires. Longer bond wires have a higher inductance than shorter bond wires, and also have a higher probability of wire sweep during encapsulation. Other problems known to artisans skilled in the art can also occur from bond wires which are overly lengthy.

As packages become thinner, it becomes necessary to make the die-lead frame assembly thinner. One way this is currently accomplished is to produce a thinner lead frame. FIG. 4 shows a 5 mil thick lead frame 40 supporting the 11 mil thick die 10 of FIGS. 2 and 3. This configuration produces a 17 mil thick assembly. One problem is that a 5 mil thick lead frame 40 is very flimsy, and further compounds the problems of lead movement listed above. It also produces package leads which can easily be damaged or misaligned.

Having a paddle downset also creates problems, as a lead frame with a paddle downset is not as manufacturable as a lead frame without a paddle downset. The paddle downset requires specialized fixtures which are not necessary for lead frames without the downset.

The paddle itself also creates extra expense. The die paddle is typically gold or silver plated along with the conductive leads, in part because the paddle cannot economically be masked during plating of the conductive leads. The leads are plated to provide the proper metallic surface to which to wire bond since the bond wire will not stick directly to the material usually used for the lead frame, such as copper or alloys. The plating of the paddle, however, serves no functional purpose. This unnecessary gold or silver plating of the paddle, which is a relatively large surface, adds unnecessary cost to the product.

3. Corner crack—Occasionally a corner of the die will break, thereby making the semiconductor useless. This can result from an uneven coefficient of expansion between the die and the die paddle. After the die is attached to the lead frame, the assembly is heated at the wire bond step to attach the wire to the die pad. If the die and the paddle expand at different rates, the corner of the die may crack. Corner crack can also occur from stress on the die due to shrinkage of the encapsulant epoxy as it cures, although in recent years chemical improvements in encapsulant epoxy has reduced this cause of corner crack.

Another cause of corner crack is metal buses, such as power or ground buses, which are often placed around the outer edges of the die during design. The buses, which are relatively large compared to the rest of the circuitry on the die, can cause the corners of the die to crack from thermal mismatch between the metal of the die and the substrate material.

SUMMARY OF THE INVENTION

An object of the invention is to provide a die-lead frame attachment means which has a reduced number of assembly steps. Another object of the invention is to provide a die-lead frame attachment means which has a reduced number of materials required for assembly. Another object of the invention is to provide a die-lead frame attachment means which is less costly to manufacture due to its reduced number of assembly steps and required materials. Another object of the invention is to provide a bus, such as for power or ground signals, which replaces the on-chip bus that is known to cause corner cracks on the semiconductor die. Another object of the invention is to provide a die-lead frame attachment means which has no thermal mismatch between the die and an attach material, thereby reducing fall-out from cracked die and die which come loose from the lead frame during wire bonding or encapsulation.

These objects of the invention are realized by providing a lead frame design having an oblong ring into which the die is set. The die can be attached to the lead frame in one of two ways. In a first embodiment, a section of tape material is attached to the bottom side of the lead frame, and the die is attached to the tape. A layer of thermoplastic provides adhesion to couple the tape to the lead frame and the die to the tape.

In a second embodiment, the ring comprises thin metal coined support pins which surround the perimeter of the ring and extend toward the center. The die is forced down into the ring, and the pins bend and hold the die in place by friction. This reduces the materials required to hold the die in place, and also prevents cracking of the die which can result from thermal mismatch between the silicon of the die and the material used to attach the die to the lead frame.

In either embodiment, the ring can function as a bus to supply, for example, power or ground connections to the die. One or more bond pads on the die would be coupled to the ring with a bond wire. The surface of the ring would be prepared by coating it with a material such as silver to facilitate coupling of a bond wire and to ensure a solid electrical connection. Plating of the ring can occur during the plating of the lead fingers.

It is not necessary that the ring surrounding the die be a continuous beam of metal. Depending on the design of the lead frame, the ring can be discontinuous because of positioning of the lead fingers, as a requirement of the manufacturing process, or even to supply two buses, for example half a ring to supply a power bus on one end of the die, and half a ring to supply a ground bus to the other end of the die.

DETAILED DESCRIPTION OF THE INVENTION

Figure 5:
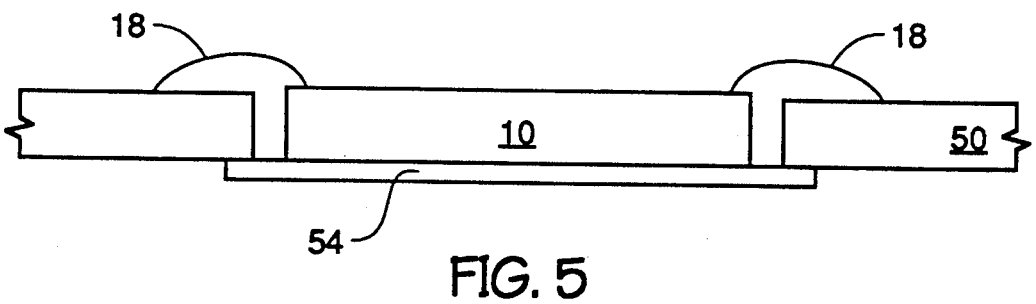
FIG. 5 is a side view of one inventive embodiment employing tape to secure the die to the lead frame.
Figure 6:
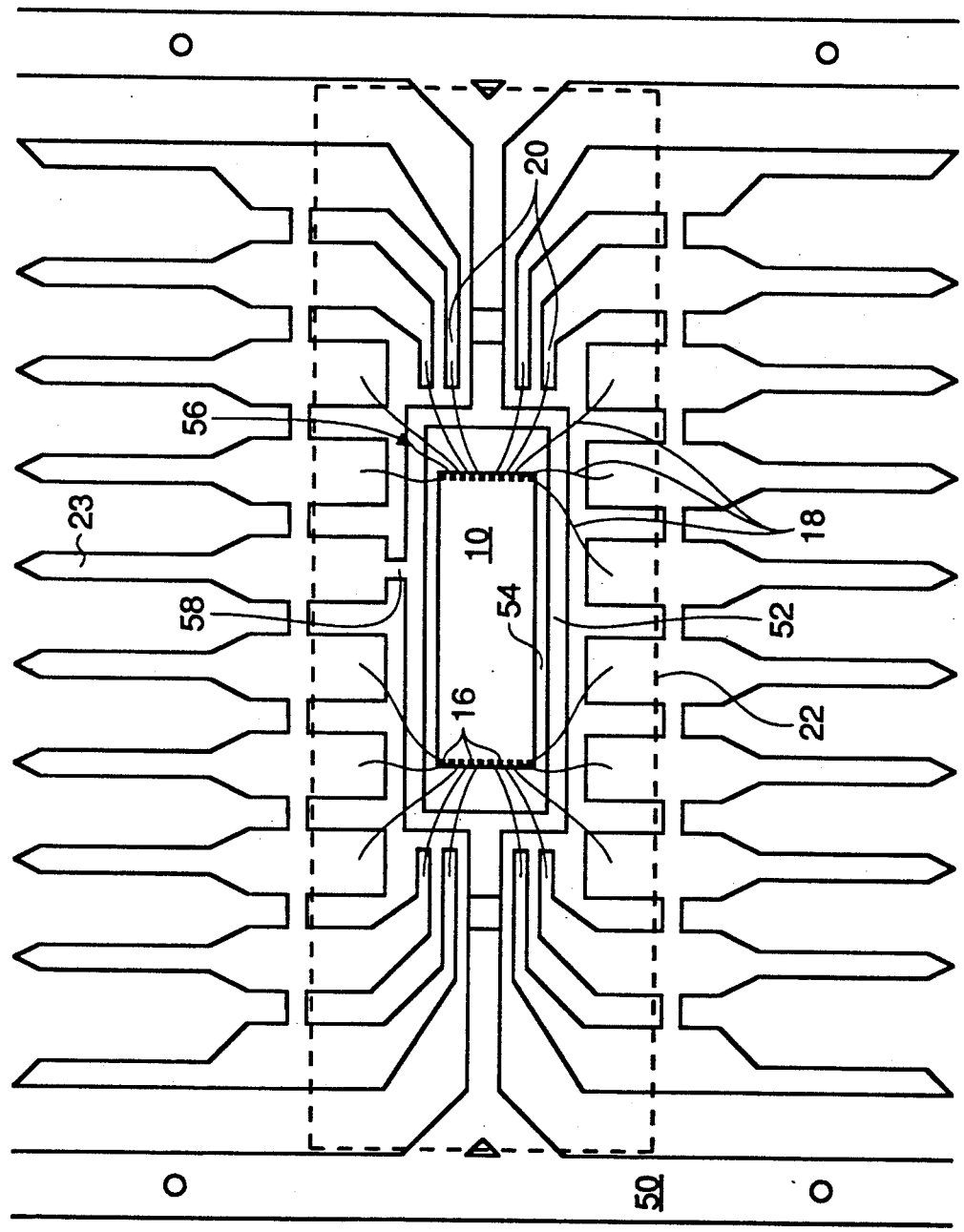
FIG. 6 is a top view of the FIG. 5 embodiment showing the ring of inventive lead frame.
Figure 8:
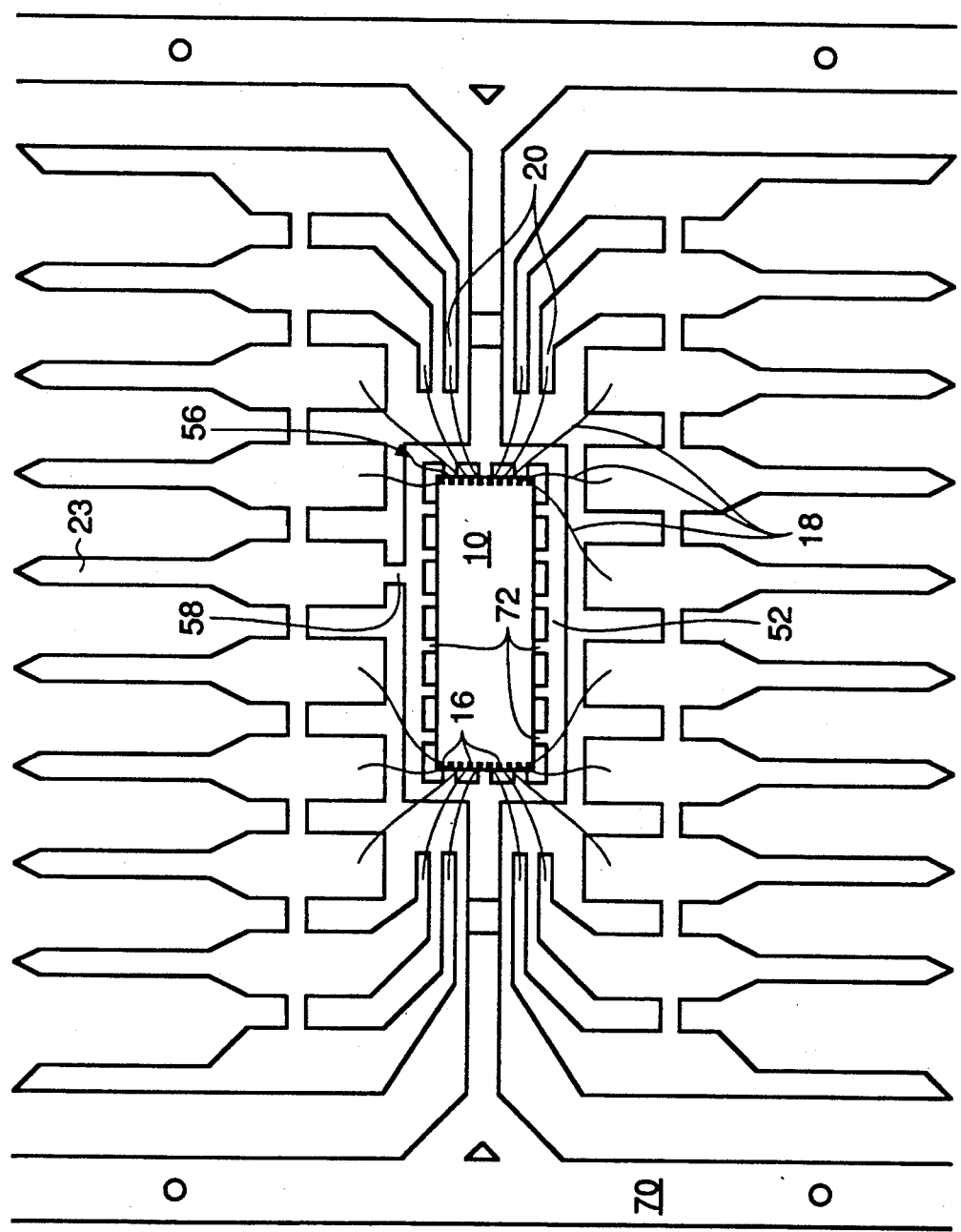
FIG. 8 is a top view of the FIG. 7 embodiment showing support pins protruding from the lead frame portion.

FIG. 5 shows a side view, and FIG. 6 shows a top view, of one inventive embodiment. A lead frame 50 having a ring 52 and lead fingers 20 receives a die 10 through the center of the ring 52. A carrier material 54, such as DuPont Kapton ® tape, holds an adhesive material (not shown) such as a thermoplastic on one side and mechanically connects the die 10 with the lead frame 50 and supports the die 10. The tape 54 can also extend beyond the ring 52 to support the lead fingers 20. Bond wires 18 couple the bond pads 16 on the die 10 with the lead fingers 20 of the lead frame 50. Bond wires 18 can also couple pads 16 on the die 10 with the ring 52, one such attachment being shown at 56. The ring 52 is coupled to a lead 23 as shown at 58, which can supply a signal such as power or ground to the die 10, thereby preventing the need for an on-chip bus. Large buses on the die, such as that for power or ground, are known to cause cracking of the substrate of the die and can cause the die to fail as well as occupying large amounts of space on the surface of the die which could be put to other uses.

In previous lead frame designs, the tips of the lead fingers are flattened and coated with a conductive material such as gold or silver to ensure coupling of the bond wire with the fingers. This is also possible with the inventive lead frame by flattening and coating the lead fingers, and coating the ring if it is used as a bus, to facilitate bonding and electrical coupling of the bond wires and the lead frame. As with conventional lead frame designs having a die paddle, it may not be possible to mask the ring in cases where it is not supplying a signal to save coating material. The surface area of the ring, however, is much smaller than the surface area of the die paddle, and would reduce the amount of material used thereby.

Figure 1:
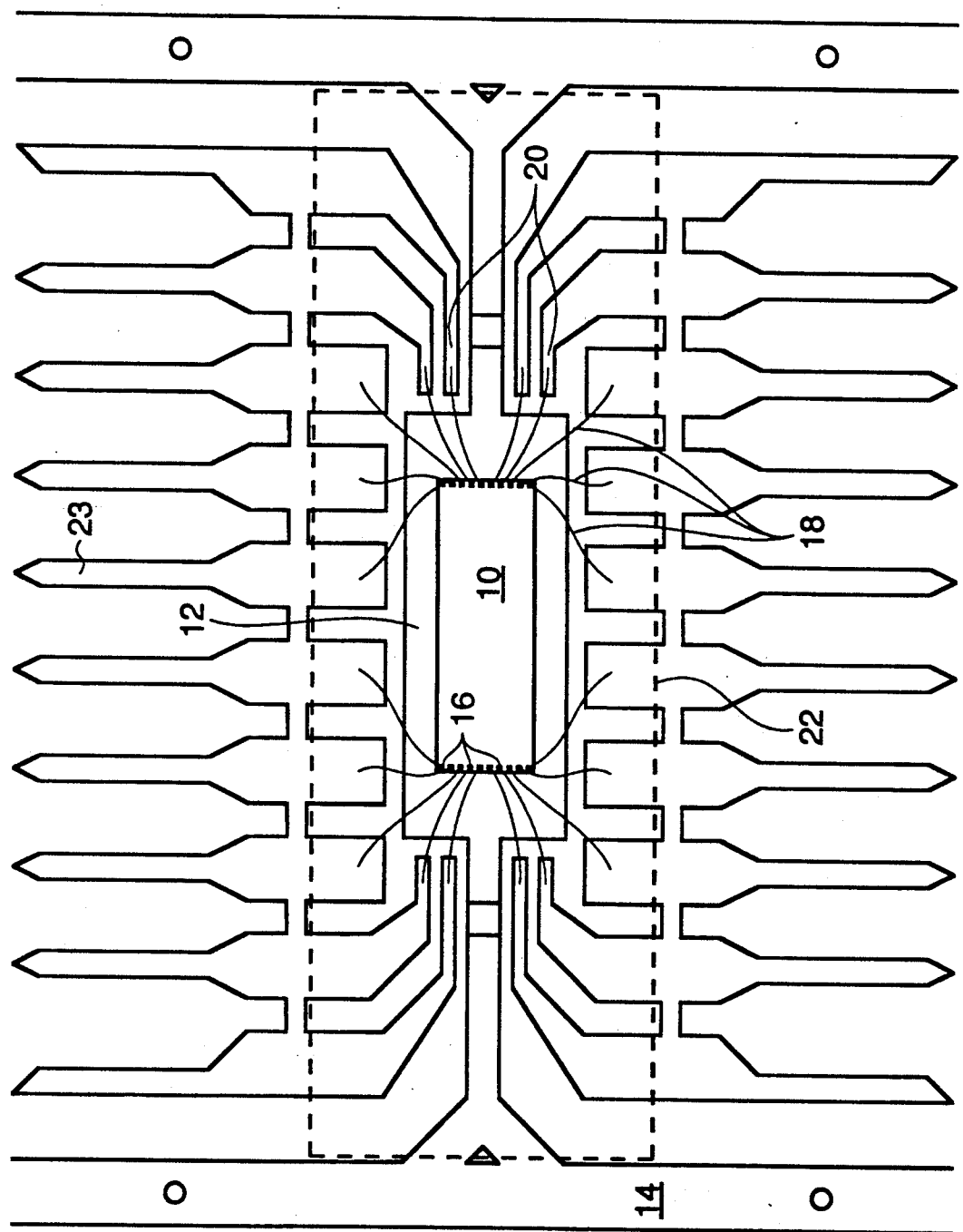
FIG. 1 is a top view of a die attached to the paddle of a lead frame.
Figure 2:
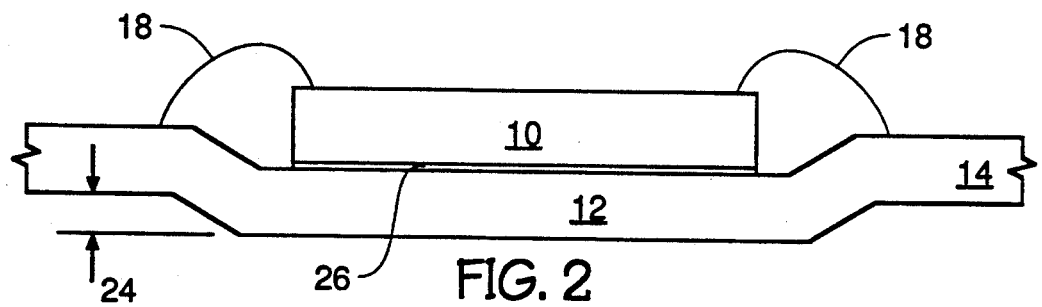
FIG. 2 is a side view of the assembly of FIG. 1 showing the downset of the paddle area of the lead frame.
Figure 3:
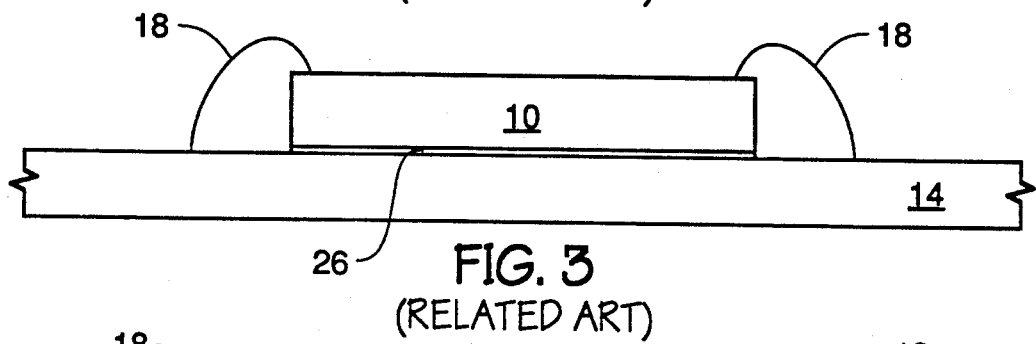
FIG. 3 is a side view of a die-lead frame assembly having no paddle downset.
Figure 4:
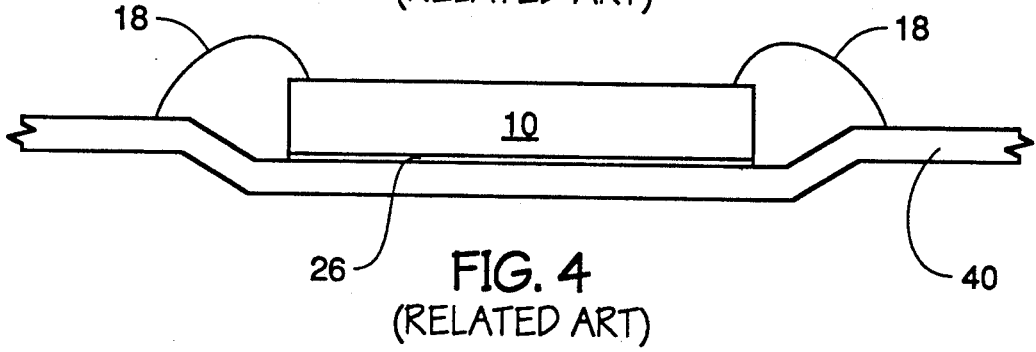
FIG. 4 is a side view of a die-lead frame assembly having a thin lead frame for use in thin packages.

With the inventive ring, the lead frame can be manufactured with a relatively large thickness to maintain its strength, and still provide a thin assembly. For example, if an 11 mil thick die is assembled with an inventive 10 mil thick lead frame and 3 mil thick tape, a 14 mil thick assembly is provided. This is clearly an advantage over the conventional method of FIG. 4 in which a 5 mil thick lead frame provides for a 17 mil thick assembly. This inventive assembly allows for 1 mil of die above the lead frame, and 3 mils of tape below the lead frame, thereby providing for an assembly which is centered within acceptable limits with respect to the lead frame and which will allow for the proper flow of plastic around the die and bond wires during the encapsulation step.

To assemble the inventive embodiment of FIGS. 5 and 6, the tape 54 is placed into contact with the lead frame 50 and the die 10 centered in the ring 52. The assembly is heated to a temperature sufficient to melt the thermoplastic adhesive coating (not shown) on the surface of the tape 54. The assembly is allowed to cool and the lead frame 50 and die 10 become attached to the tape 54 by the thermoplastic adhesive. Normal wire-bonding is then performed on the assembly. The thermoplastic adhesive softens at about 250° C., while encapsulation normally occurs at about 175° C. Therefore, the thermoplastic adhesive would not soften during the encapsulation process.

Attachment of one or more bond pads 16 to the metal ring 52 surrounding the die 10, which can supply power, ground, or other signals, can be performed as shown at 56. The ring 52 is electrically coupled to a lead 23 of the lead frame 52 as shown at 58. The lead 23, and therefore the ring 52, is then coupled to a signal, for example ground, through connections within the host, and the pad on the die corresponding to ground is wire bonded to the metal ring 52.

Figure 7:
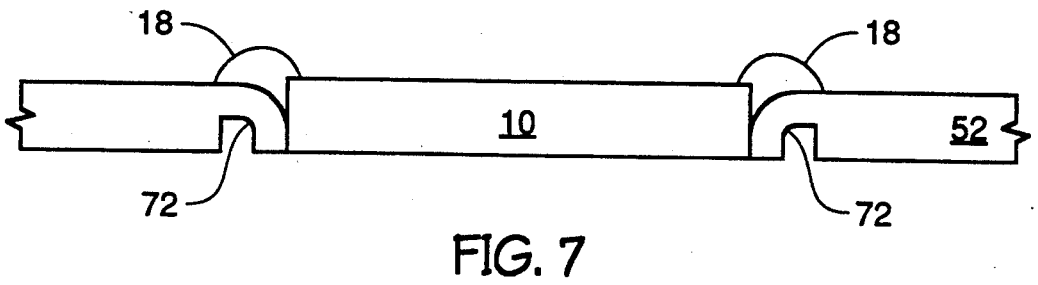
FIG. 7 is a side view of a second inventive embodiment employing support pins which provide lateral pressure to the die, thereby holding the die in place with friction.

In a second inventive embodiment, a cross section of which is shown in FIG. 7, the die 10 is connected to the lead frame 70 not by the tape of the first embodiment, but instead by thin metal support pins 72 which protrude from the inside edge of the ring toward the center of the ring. As the die 10 is centered in the metal ring, pressure is applied to the upper surface of the die 10. The support pins 72 bend, and the die 10 is held in place by friction between the plurality of support pins 72 and the die 10. The number of support pins 72 required is arbitrary, but the number should be sufficient to prevent excess movement of the die 10 which would weaken or destroy the electrical coupling provided by the bond wires 18. In addition, even pressure should be applied to the die 10 as it is being placed in the lead frame 70 to prevent excess stress on the die 10 which could crack the substrate and cause the surface circuitry to fail.

The support pins 72 are manufactured as a step in the lead frame 70 manufacturing step. The top surface of the pins 72 are even with the top surface of the lead frame 70, and extend out approximately the thickness of the lead frame 70. After the die 10 is inserted into the ring, which bends the pins 72, the bottom of the pins 72 are even with the bottom of the lead frame 70. To accomplish this, the thickness of the pins 72 is approximately half the thickness of the lead frame 70. This can be accomplished by several means, for example by stamping the pins 72 to make them half their original thickness during the lead area coining process, or by chemical etching if etching process is used to manufacture the lead frame.

What have been described are specific configurations of the invention, as applied to particular embodiments. Clearly, variations can be made to the original designs described in this document for adapting the invention to other embodiments. For example, electrical attachment means between the die and the lead frame could be accomplish by means other than a bond wire. Also, mechanical connection means between the die and lead frame could be accomplished by means other than the support pins or tape described herein. Therefore, the invention should be read as limited only by the appended claims.

I claim:

1. A semiconductor device having a lead frame for the passage of an electrical potential between a semiconductor die and a host into which the semiconductor device is installed, the die having first and second parallel major surfaces, and the lead frame comprising:
   a) first and second parallel major surfaces;
   b) lead fingers electrically coupled with said die;
   c) leads electrically coupled to said lead fingers, said leads allowing for electrical coupling with the host into which the semiconductor device is installed;
   d) a lead frame portion having a void therein for receiving the die such that said first major surface of said die is positioned inferiorly to said first major surface of said lead frame and said second major surface of said die is positioned superiorly to said second major surface of said lead frame wherein said lead frame portion is interposed between said die and said lead fingers.

2. The semiconductor device of claim 1 wherein said die is attached to said lead frame by tape which contacts said first major surface of said die and said second major surface of said lead frame.

3. The semiconductor device of claim 2 wherein said tape comprises a plastic sheet coated on one side by a layer of thermoplastic, said thermoplastic contacting said first major surface of said die and said second major surface of said lead frame.

4. The semiconductor device of claim 1 wherein said die is attached to said lead frame by a plurality of support pins protruding from said lead frame portion having said void, said support pins applying lateral pressure to said die.

5. The semiconductor device of claim 1 wherein said die comprises bond pads which are electrically coupled to said lead fingers by bond wires.

6. The semiconductor device of claim 1 wherein said lead frame portion having said void is electrically coupled to one of said leads, and wherein said die is electrically coupled to said lead frame portion.

7. The semiconductor device of claim 1 wherein said lead frame portion having said void comprises a first segment which is electrically isolated from a second segment of said lead frame portion.

8. The semiconductor device of claim 6 wherein said lead frame portion having said void comprises a first segment which is electrically isolated from a second segment of said lead frame portion, and wherein said first and second segments are electrically coupled to a different lead, and wherein said die is electrically coupled to said segments.

9. A lead frame for the passage of an electrical potential between a semiconductor die and a host into which the semiconductor device is installed, the die having first and second parallel major surfaces, and the lead frame comprising:
   a) first and second parallel major surfaces;
   b) lead fingers electrically coupled with said die;
   c) leads electrically coupled to said lead fingers, said leads allowing for electrical coupling with the host into which the semiconductor device is installed;
   d) a lead frame portion having a void therein for receiving the die such that said first major surface of said die is positioned inferiorly to said first major surface of said lead frame and said second major surface of said die is positioned superiorly to said second major surface of said lead frame wherein said lead frame portion is interposed between said die and said lead fingers.

10. The lead frame of claim 9 wherein said die is attached to said lead frame by tape which contacts said first major surface of said die and said second major surface of said lead frame.

11. The lead frame of claim 10 wherein said tape comprises a plastic sheet coated on one side by a layer of thermoplastic, said thermoplastic contacting said first major surface of said die and said second major surface of said lead frame.

12. The lead frame of claim 9 wherein said die is attached to said lead frame by a plurality of support pins protruding from said lead frame portion having said void, said support pins applying lateral pressure to said die.

13. The lead frame of claim 9 wherein said die comprises bond pads which are electrically coupled to said lead fingers by bond wires.

14. The lead frame of claim 9 wherein said lead frame portion having said void is electrically coupled to one of said leads, and wherein said die is electrically coupled to said lead frame portion.

15. The lead frame of claim 9 wherein said lead frame portion having said void comprises a first segment which is electrically isolated from a second segment of said lead frame portion.

16. The lead frame of claim 14 wherein said lead frame portion having said void comprises a first segment which is electrically isolated from a second segment of said lead frame portion, and wherein said first and second segments are electrically coupled to a different lead, and wherein said die is electrically coupled to said segments.

17. A lead frame for the passage of an electrical potential between a semiconductor die and a host into which the semiconductor die is installed, the die having first and second parallel major surfaces, the lead frame comprising:
   a) first and second parallel major surfaces;
   b) lead fingers electrically coupled with said die;
   c) leads electrically coupled to said lead fingers, said leads allowing for electrical coupling with the host into which the semiconductor device is installed;
   d) a lead frame portion having a void therein for receiving the die, the lead frame having a ring which encircles the die thereby providing a bus to the die when the die is attached to the lead frame, said first major surface of said die being positioned inferiorly to said first major surface of said lead frame and said second major surface of said die being positioned superiorly to said second major surface of said lead frame wherein said ring is interposed between said die and said lead fingers.

* * * * *